US010872800B2

(12) United States Patent
Parkhe

(10) Patent No.: US 10,872,800 B2
(45) Date of Patent: *Dec. 22, 2020

(54) ELECTROSTATIC CHUCK ASSEMBLY FOR HIGH TEMPERATURE PROCESSES

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 359 days.

This patent is subject to a terminal disclaimer.

(21) Appl. No.: 15/908,654

(22) Filed: Feb. 28, 2018

(65) Prior Publication Data

US 2018/0190528 A1 Jul. 5, 2018

Related U.S. Application Data

(63) Continuation of application No. 14/878,955, filed on Oct. 8, 2015, now Pat. No. 10,008,404.

(Continued)

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67103* (2013.01); *H01L 21/67109* (2013.01); *H01L 21/6831* (2013.01); *H01L 21/68785* (2013.01)

(58) Field of Classification Search
CPC ........ B08B 15/00; B23K 10/00; B23K 10/02; B23K 37/0461; G03F 7/70708;

(Continued)

(56) References Cited

U.S. PATENT DOCUMENTS 4,273,148 A 6/1981 Charland
4,305,567 A 12/1981 Lunt
(Continued)

FOREIGN PATENT DOCUMENTS

JP 2009164483 A 7/2009
JP 2013251354 A 12/2013

OTHER PUBLICATIONS

U.S. Appl. No. 14/830,389, Electrostatic Puck Assembly With Metal Bonded Backing Plate for High Temperature Processes, filed Aug. 19, 2015.

(Continued)

*Primary Examiner* — Jared Fureman
*Assistant Examiner* — Nicolas Bellido
(74) *Attorney, Agent, or Firm* — Lowenstein Sandler LLP

(57) ABSTRACT

An electrostatic chuck assembly includes a puck and a cooling plate. The puck includes an electrically insulative upper puck plate comprising one or more heating elements and one or more electrodes to electrostatically secure a substrate and further includes a lower puck plate bonded to the upper puck plate by a metal bond, the lower puck plate comprising a plurality of features distributed over a bottom side of the lower puck plate at a plurality of different distances from a center of the lower puck plate, wherein each of the plurality of features accommodates one of a plurality of fasteners. The cooling plate is coupled to the puck by the plurality of fasteners, wherein the plurality of fasteners each apply an approximately equal fastening force to couple the cooling plate to the puck.

20 Claims, 6 Drawing Sheets

Related U.S. Application Data

(60) Provisional application No. 62/065,503, filed on Oct. 17, 2014.

(58) Field of Classification Search
CPC .......... H01J 37/32091; H01J 37/32477; H01J 37/32715; H01L 21/67103; H01L 21/67109; H01L 21/6831; H01L 21/6833; H01L 21/68721; H01L 21/68785; H01L 21/67248; H01L 21/6875; H02N 13/00; H05B 7/185; H05H 1/34; H05H 1/48
USPC .............. 361/234; 219/121.58, 121.36; 156/345.29; 269/289
See application file for complete search history.

(56) References Cited

U.S. PATENT DOCUMENTS

| | | | |
|---|---|---|---|
| 5,421,594 A * | 6/1995 | Becerra | F16J 15/122 277/608 |
| 5,535,090 A | 7/1996 | Sherman | |
| 5,851,298 A | 12/1998 | Ishii | |
| 6,219,219 B1 | 4/2001 | Hausmann et al. | |
| 6,310,755 B1 | 10/2001 | Kholodenko et al. | |
| 6,503,368 B1 | 1/2003 | Kholodenko et al. | |
| 7,697,260 B2 | 4/2010 | Brown et al. | |
| 8,194,384 B2 | 6/2012 | Nasman et al. | |
| 8,390,980 B2 | 3/2013 | Sansoni et al. | |
| 8,559,159 B2 | 10/2013 | Roy et al. | |
| 10,008,399 B2 * | 6/2018 | Parkhe | H01L 21/6831 |
| 10,008,404 B2 | 6/2018 | Parkhe | |
| 2002/0050246 A1 | 5/2002 | Parkhe | |
| 2003/0104186 A1 | 6/2003 | Ito | |
| 2004/0226515 A1 | 11/2004 | Yendler et al. | |
| 2005/0219786 A1 | 10/2005 | Brown et al. | |
| 2005/0241765 A1 | 11/2005 | Dhindsa et al. | |
| 2006/0096946 A1 | 5/2006 | Schaepkens et al. | |
| 2006/0098379 A1 | 5/2006 | Otaka et al. | |
| 2006/0279899 A1 | 12/2006 | Aihara et al. | |
| 2008/0029032 A1 | 2/2008 | Sun et al. | |
| 2008/0089001 A1 | 4/2008 | Parkhe et al. | |
| 2008/0138645 A1 | 6/2008 | Kawajiri et al. | |
| 2009/0014323 A1 | 1/2009 | Yendler et al. | |
| 2010/0003824 A1 | 1/2010 | Kadkhodayan et al. | |
| 2010/0020463 A1 | 1/2010 | Nasman et al. | |
| 2010/0039747 A1 * | 2/2010 | Sansoni | H01L 21/6831 361/234 |
| 2011/0292562 A1 | 12/2011 | Lee et al. | |
| 2012/0076574 A1 * | 3/2012 | Parkhe | B23K 1/0008 403/272 |
| 2012/0100379 A1 * | 4/2012 | Luo | C08J 5/125 428/421 |
| 2013/0088808 A1 | 4/2013 | Parkhe et al. | |
| 2013/0276980 A1 | 10/2013 | Lubomirsky et al. | |
| 2013/0286533 A1 | 10/2013 | Takasaki et al. | |
| 2014/0159325 A1 | 6/2014 | Parkhe et al. | |
| 2014/0209245 A1 | 7/2014 | Yamamoto et al. | |
| 2014/0334060 A1 | 11/2014 | Parkhe et al. | |
| 2015/0036261 A1 | 2/2015 | Jindo et al. | |
| 2015/0077895 A1 | 3/2015 | Jindo et al. | |
| 2016/0111315 A1 | 4/2016 | Parkhe | |
| 2016/0276198 A1 | 9/2016 | Anada et al. | |
| 2016/0343600 A1 * | 11/2016 | Parkhe | H01L 21/67103 |
| 2018/0197758 A1 | 7/2018 | Parkhe | |
| 2019/0341289 A1 * | 11/2019 | Parkhe | H01L 21/6833 |

OTHER PUBLICATIONS

U.S. Appl. No. 15/061,734, Substrate Support Assembly for High Temperature Processes, filed Mar. 4, 2016.
International Search Report and Written Opinion of the international Searching Authority for PCT Application No. PCT/US2015/054982 dated Feb. 15, 2016, 15 pages.
International Search Report and Written Opinion of the International Searching Authority for PCT Application No. PCT/US2016/013698 dated Apr. 25, 2016.
International Search Report and Written Opinion of the international Searching Authority for PCT Application No. PCT/US2017/014531 dated May 2, 2017, 14 pages.
Pollock, M., ed., "GRAFOIL® Flexible Graphite, Engineering Design Manual," 2nd edition, Copyright 2002, 117 pages, Graphtech Inc.
"Cirlex™ Thick Polyimide, H Types", MSDS No. CIR00001, Revised Oct. 8, 1996, printed Jan. 5, 1999, 6 pages.

\* cited by examiner

ELECTROSTATIC CHUCK ASSEMBLY FOR HIGH TEMPERATURE PROCESSES

RELATED APPLICATIONS

This patent application is a continuation of U.S. patent application Ser. No. 14/878,955, filed Oct. 8, 2015, which claims the benefit under 35 U.S.C. § 119(e) of U.S. Provisional Application No. 62/065,503, filed Oct. 17, 2014, both of which are incorporated by reference herein.

TECHNICAL FIELD

Some embodiments of the present invention relate, in general, to a substrate support assembly (also referred to as an electrostatic chuck assembly) that is usable for high temperature processes.

BACKGROUND

Electrostatic chucks are widely used to hold substrates, such as semiconductor wafers, during substrate processing in processing chambers used for various applications, such as physical vapor deposition, etching, or chemical vapor deposition. Electrostatic chucks typically include one or more electrodes embedded within a unitary chuck body which includes a dielectric or semi-conductive ceramic material across which an electrostatic clamping field can be generated.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to a chucking surface to allow a greater degree of control over substrate temperature.

Various processes used in the fabrication of integrated circuits may call for high temperatures and/or wide temperature ranges for substrate processing. However, electrostatic chucks in etch processes typically operate in a temperature range of up to about 120° C. At temperatures above about 120° C., the components of many electrostatic chucks will begin to fail due to various issues such as de-chucking in AlO electrostatic chucks, plasma erosion from corrosive chemistry, bond reliability, and so on.

SUMMARY

Some embodiments of the present invention described herein cover an electrostatic chuck assembly that includes a puck with an electrically insulative upper puck plate comprising one or more heating elements and one or more electrodes to electrostatically secure a substrate and a lower puck plate bonded to the upper puck plate by a metal bond. The lower puck plate includes multiple features distributed over a bottom side of the lower puck plate at different distances from a center of the lower puck plate, wherein each of the features accommodates a fastener. The electrostatic chuck assembly further includes a cooling plate coupled to the puck by the fasteners. The fasteners each apply an approximately equal fastening force to couple the cooling plate to the puck.

Some embodiments of the present invention described herein cover an electrostatic puck that includes an AlN or $Al_2O_3$ upper puck plate with one or more heating elements and one or more electrodes to electrostatically secure a substrate. The electrostatic puck further includes a lower puck plate bonded to the upper puck plate by a metal bond. The lower puck plate is composed of one of a) Molybdenum, b) a SiC porous body infiltrated with an AlSi alloy, or c) a ceramic such as AlN or $Al_2O_3$. The lower puck plate further includes multiple features distributed over a bottom side of the lower puck plate at different distances from a center of the lower puck plate, wherein each of the features accommodates a fastener.

Some embodiments of the present invention described herein cover a method of manufacturing an electrostatic chuck assembly. The method includes forming a plurality of features in a lower puck plate. The method further includes bonding the lower puck plate to an upper puck plate with a metal bond to form a puck, the upper puck plate comprising one or more heating elements and one or more electrodes to electrostatically secure a substrate. The method further includes disposing at least one of a perfluoropolymer (PFP) gasket or a PFP o-ring to a top side of at least a portion of a cooling plate. The method further includes inserting one of a plurality of fasteners into each of the plurality of features formed in the lower puck plate. The method further includes coupling the cooling plate to the puck by tightening the plurality of fasteners. The plurality of fasteners may be tightened approximately equally to apply an approximately equal fastening force to couple the cooling plate to the puck.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide a substrate support assembly and an electrostatic chuck assembly including a puck that is coupled to a cooling plate by a collection of fasteners. Multiple fasteners are used to secure the puck to the cooling plate. The multiple fasteners are located at different distances from a center of the puck. In one embodiment, a first set of fasteners are disposed at a first radius from the center of the puck and a second set of fasteners are disposed at a second radius from the center of the puck. The multiple fasteners may be approximately uniformly distributed across a top side or surface of the cooling plate to evenly distribute a fastening force to couple the puck to the cooling plate. The fasteners may all be tightened an equal amount to ensure that the fastening forces applied by each fastener is about the same. This facilitates uniform heat transfer properties between the puck and the cooling plate over the puck.

In one embodiment, an electrostatic chuck assembly includes a puck having an electrically insulative upper puck plate bonded to a lower puck plate by a metal bond. The metal bond may be an aluminum bond, an AlSi alloy bond, or other metal bond. The upper puck plate includes one or more heating elements and one or more electrodes to electrostatically secure a substrate. The lower puck plate includes multiple features distributed over a bottom side of the lower puck plate at different distances from a center of the lower puck plate. Each of the features accommodates one of a plurality of fasteners. The electrostatic chuck assembly further includes a cooling plate coupled to the puck by the fasteners. The cooling plate may include a base portion (referred to as a cooling base) and a spring loaded inner heat sink connected to the base portion by a plurality of springs, wherein the plurality of springs apply a force to press the inner heat sink against the puck. The fasteners each apply an approximately equal fastening force to couple the cooling plate to the puck (e.g., to couple the base portion of the cooling plate to the puck). This approximately equal fastening force may facilitate uniform heat transfer between the cooling plate and the puck. Additionally, the spring loaded inner heat sink may also facilitate uniform heat transfer between the cooling plate and the puck.

Figure 1:
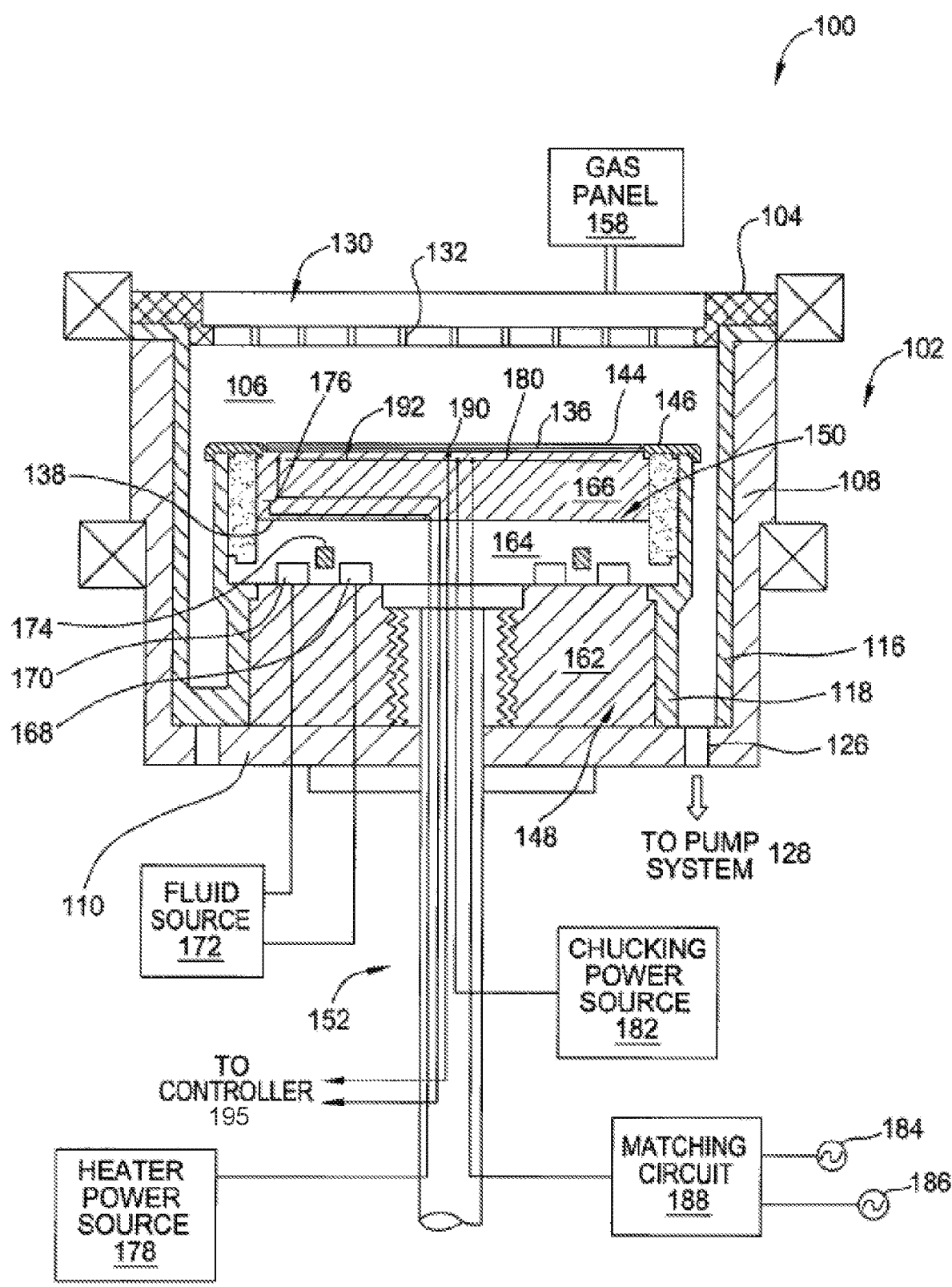
FIG. 1 depicts a sectional side view of one embodiment of a processing chamber.

FIG. 1 is a sectional view of one embodiment of a semiconductor processing chamber 100 having an electrostatic chuck assembly 150 disposed therein. The electrostatic chuck assembly 150 includes an electrostatic puck (puck 166) having an upper puck plate bonded to a lower puck plate, as will be discussed in greater detail below. The puck 166 is coupled to a cooling plate by multiple fasteners, as discussed in greater detail below.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the sidewalls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

A substrate support assembly 148 is disposed in the interior volume 106 of the processing chamber 100 below the gas distribution assembly 130. The substrate support assembly 148 holds a substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and electrostatic chuck assembly 150. In one embodiment, the electrostatic chuck assembly 150 further includes a thermally conductive base referred to herein as a cooling plate 164 coupled to an electrostatic puck (referred to hereinafter as a puck 166) by multiple fasteners. The electrostatic chuck assembly 150 described in embodiments may be used for Johnsen-Rahbek and/or Coulombic electrostatic chucking.

In one embodiment, a protective ring 146 is disposed over a portion of the puck 166 at an outer perimeter of the puck 166. In one embodiment, the puck 166 is coated with a protective layer 136. Alternatively, the puck 166 may not be coated by a protective layer 136. The protective layer 136 may be a ceramic such as $Y_2O_3$ (yttria or yttrium oxide), $Y_4Al_2O_9$(YAM), $Al_2O_3$ (alumina), $Y_3Al_5O_{12}$ (YAG), YAlO3 (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$(YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The puck 166 includes an upper puck plate (not shown) and a lower puck plate (not shown) bonded by a metal bond. The upper puck plate may be a dielectric or electrically insulative material (e.g., having an electrical resistivity of greater than $10^{14}$ Ohm·meter) that is usable for semiconductor processes at temperatures of 180° C. and above. In one embodiment, the upper puck plate is composed of materials usable from about 20° C. to about 500° C. In one embodiment, the upper puck plate is AlN. The AlN upper puck plate may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the upper puck plate is $Al_2O_3$. The $Al_2O_3$ upper puck plate may be undoped or may be doped. For example, the $Al_2O_3$ may be doped with Titanium dioxide ($TiO_2$) or a transition metal oxide.

The lower puck plate may have a coefficient of thermal expansion that is matched to a coefficient of thermal expansion of the upper puck plate. In one embodiment, the lower puck plate is a SiC porous body that is infiltrated with an AlSi alloy (referred to as AlSiSiC). The lower puck plate may alternatively be AlN or $Al_2O_3$. In one embodiment, the lower puck plate is undoped AlN or undoped $Al_2O_3$. In one embodiment, the lower puck plate is composed of the same material as the upper puck plate. The AlSiSiC material, AlN or $Al_2O_3$ may be used, for example, in reactive etch environments or in inert environments.

In one embodiment, the lower puck plate is Molybdenum. Molybdenum may be used, for example, if the puck 166 is to be used in an inert environment. Examples of inert environments include environments in which inert gases such as Ar, O2, N, etc. are flowed. Molybdenum may be used, for example, if the puck 166 is to chuck a substrate for metal deposition. Molybdenum may also be used for the lower puck plate for applications in a corrosive environment (e.g., etch applications). In such an embodiment, exposed surfaces of the lower puck plate may be coated with a plasma resistant coating after the lower puck plate is bonded to the upper puck plate. The plasma coating may be performed via a plasma spray process. The plasma resistant coating may cover, for example, sidewalls of the lower puck plate and an exposed horizontal step of the lower puck plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck 166. The cooling plate 164 and/or puck 166 may include one or more optional embedded heating elements 176, optional embedded thermal isolators 174 and/or optional conduits 168, 170 to control a lateral temperature profile of the substrate support assembly 148. In one embodiment, a thermal gasket 138 is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The conduits 168, 170 and embedded heating elements 176 may be utilized to control the temperature of the puck 166, thereby heating and/or cooling the puck 166 and a substrate (e.g., a wafer) being processed. In one embodiment, the puck 166 includes two separate heating zones that can maintain distinct temperatures. In another embodiment, the puck 166 includes four different heating zones that can maintain distinct temperatures. The temperature of the electrostatic puck 166 and the thermally conductive base 164 may be monitored using multiple temperature sensors 190, 192, which may be monitored using a controller 195.

The puck 166 may further include multiple gas passages such as grooves, mesas and other surface features that may be formed in an upper surface of the puck 166. The gas passages may be fluidly coupled to a source of a heat transfer (or backside) gas, such as He via holes drilled in the puck 166. In operation, the backside gas may be provided at controlled pressure into the gas passages to enhance the heat transfer between the puck 166 and the substrate 144.

In one embodiment, the puck 166 includes at least one clamping electrode 180 controlled by a chucking power source 182. The clamping electrode 180 (also referred to as a chucking electrode) may further be coupled to one or more RF power sources 184, 186 through a matching circuit 188 for maintaining a plasma formed from process and/or other gases within the processing chamber 100. The one or more RF power sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
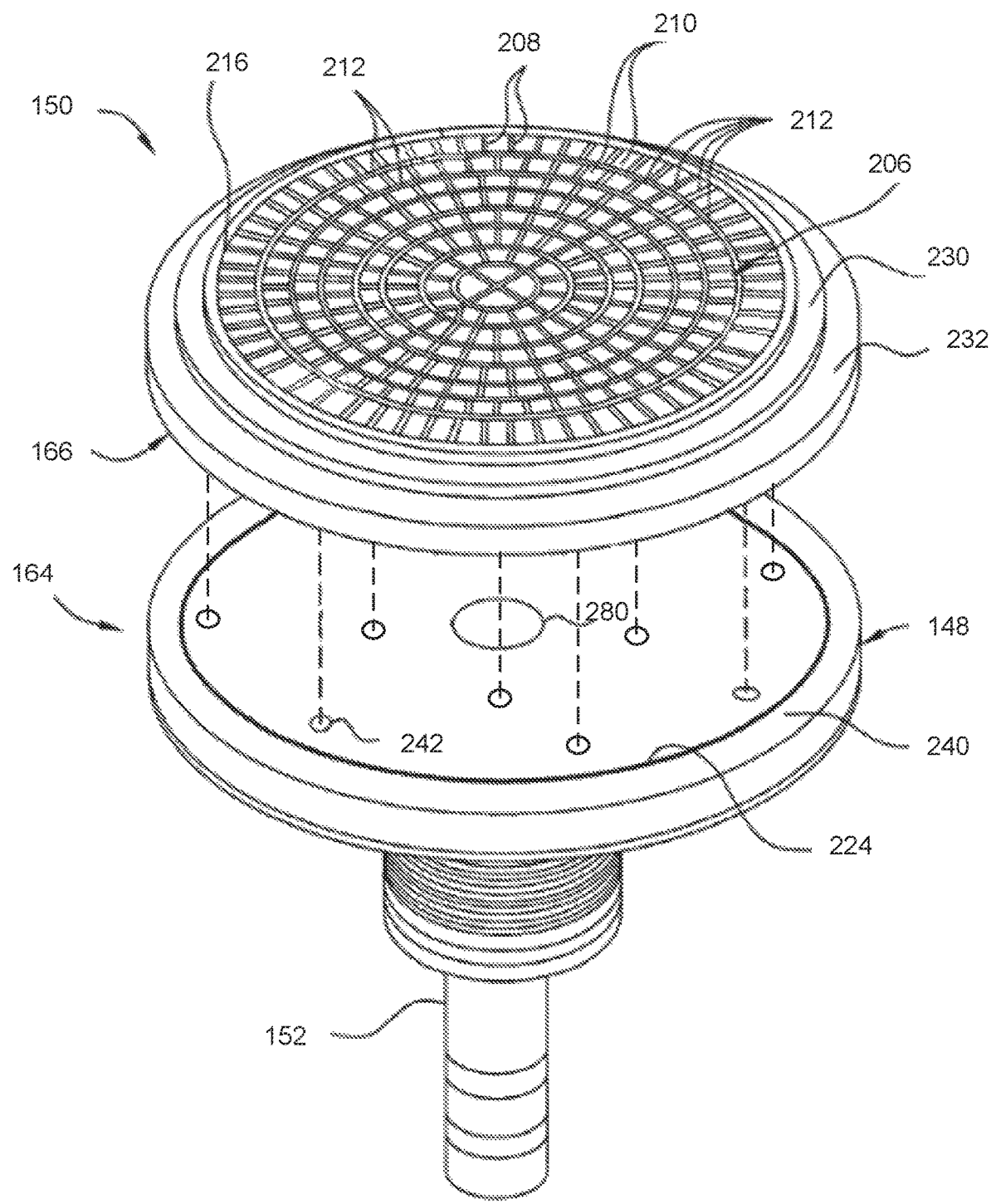
FIG. 2 depicts an exploded view of one embodiment of a substrate support assembly.

FIG. 2 depicts an exploded view of one embodiment of the substrate support assembly 148. The substrate support assembly 148 depicts an exploded view of the electrostatic chuck assembly 150 including the puck 166 and the pedestal 152. The electrostatic chuck assembly 150 includes the puck 166, as well as the cooling plate 164 attached to the puck 166. As shown, an o-ring 240 may be vulcanized to the cooling plate 164 along a perimeter of a top side of the cooling plate 164. Alternatively, the o-ring may be disposed on the top side of the cooling plate 164 without being vulcanized thereto. Embodiments are discussed herein with reference to o-rings and gaskets that are vulcanized to at least a portion of the cooling plate 164. However, it should be understood that the o-rings and/or gaskets may alternatively be vulcanized to the lower puck plate. Alternatively, the o-rings and/or gaskets may not be vulcanized to any surface. In one embodiment, the o-ring 240 is a perfluoropolymer (PFP) o-ring. Alternatively, other types of high temperature o-rings may be used. In one embodiment, thermally insulating high temperature o-rings are used. The o-ring 240 may be a stepped o-ring having a first step at a first thickness and a second step at a second thickness. This may facilitate uniform tightening of fasteners by causing the amount of force used to tighten the fasteners to increase dramatically after a set amount of compression of the PFP o-ring 240.

Additional o-rings (not shown) may also be vulcanized to the top side of the cooling plate around a hole 280 at a center of the cooling plate 164 through which cables are run. Other smaller o-rings may also be vulcanized to the cooling plate 164 around other openings, around lift pins, and so forth. Alternatively, a gasket (e.g., a PFP gasket) may be vulcanized to the top side of the cooling plate 164. Examples of PFPs usable for the gasket or o-ring 240 are Dupont's™ ECCtreme™, Dupont's KALREZ® and Daikin's® DUPRA™. The o-ring 240 or gasket provide a vacuum seal between a chamber interior volume and interior volumes within the electrostatic chuck assembly 150. The interior volumes within the electrostatic chuck assembly 150 include open spaces within the pedestal 152 for routing conduits and wiring.

The cooling plate 164 additionally includes numerous features 242 through which fasteners are inserted. If a gasket is used, the gasket may have cutouts at each of the features 242. Fasteners extend through each of the features 242 and attach to additional portions of the fasteners (or additional fasteners) that are inserted into additional features formed in the puck 166. For example, a bolt may extend through a feature 242 in the cooling plate 164 and be screwed into a nut disposed in a feature of the puck 166. Each feature 242 in the cooling plate 164 may line up to a similar feature (not shown) in a lower puck plate 232 of puck 166.

The puck 166 has a disc-like shape having an annular periphery that may substantially match the shape and size of a substrate positioned thereon. An upper surface of the puck 166 may have an outer ring 216, multiple mesas 206, 210 and channels 208, 212 between the mesas 210. The puck 166 includes an upper puck plate 230 bonded to the lower puck plate 232 by a metal bond. In one embodiment, the upper puck plate 230 may be fabricated by an electrically insulative ceramic material. Suitable examples of the ceramic materials include aluminum nitride (AlN), alumina ($Al_2O_3$), and the like.

In one embodiment, the material used for the lower puck plate 232 may be suitably chosen so that a coefficient of thermal expansion (CTE) for the lower puck plate 232 material substantially matches the CTE of the electrically insulative upper puck plate 230 material in order to minimize CTE mismatch and avoid thermo-mechanical stresses which may damage the puck 166 during thermal cycling. In one embodiment, the lower puck plate 232 is Molybdenum. In one embodiment, the lower puck plate is alumina. In one embodiment, the lower puck plate is AlN.

In one embodiment, an electrically conductive metal matrix composite (MMC) material is used for the lower puck plate 232. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC, and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material for the lower puck plate 232 is preferably chosen to provide the desired electrical conductivity and to substantially match the CTE of the upper puck plate 230 material over the operating temperature range for the electrostatic chuck assembly 150. In one embodiment, the temperature may range from about 20° Celsius to about 500° Celsius. In one embodiment, matching the CTEs is based on selecting the MMC material so that the MMC material includes at least one material which is also used in the upper puck plate 230 material. In one embodiment, the upper puck plate 230 includes AlN. In one embodiment, the MMC material includes a SiC porous body that is infiltrated with an AlSi alloy.

The constituent materials and composition percentages of the MMC may be selected to provide an engineered material which meets desirable design objectives. For example, by suitably selecting the MCC material to closely match the CTEs of the lower puck plate 232 and upper puck plate 230, the thermo-mechanical stresses at an interface between the lower puck plate 232 and the upper puck plate 230 are reduced.

The lower puck plate 232 may include numerous features (not shown) for receiving fasteners. The features may be approximately evenly distributed across a surface of the lower puck plate 232, and may include a first set of features at a first distance from a center of the lower puck plate 232 and a second set of features at a second distance from the center of the lower puck plate 232.

The cooling plate 164 attached below the puck 166 may have a disc-like main portion 224 and an annular flange extending outwardly from the main portion 224 and positioned on the pedestal 152. In one embodiment, the cooling plate 164 may be fabricated by a metal, such as aluminum or stainless steel or other suitable materials. Alternatively, the cooling plate 164 may be fabricated by a composite ceramic, such as an aluminum-silicon alloy infiltrated SiC or Molybdenum to match a thermal expansion coefficient of the puck 166. The cooling plate 164 should provide good strength and durability as well as heat transfer properties.

Figure 3:
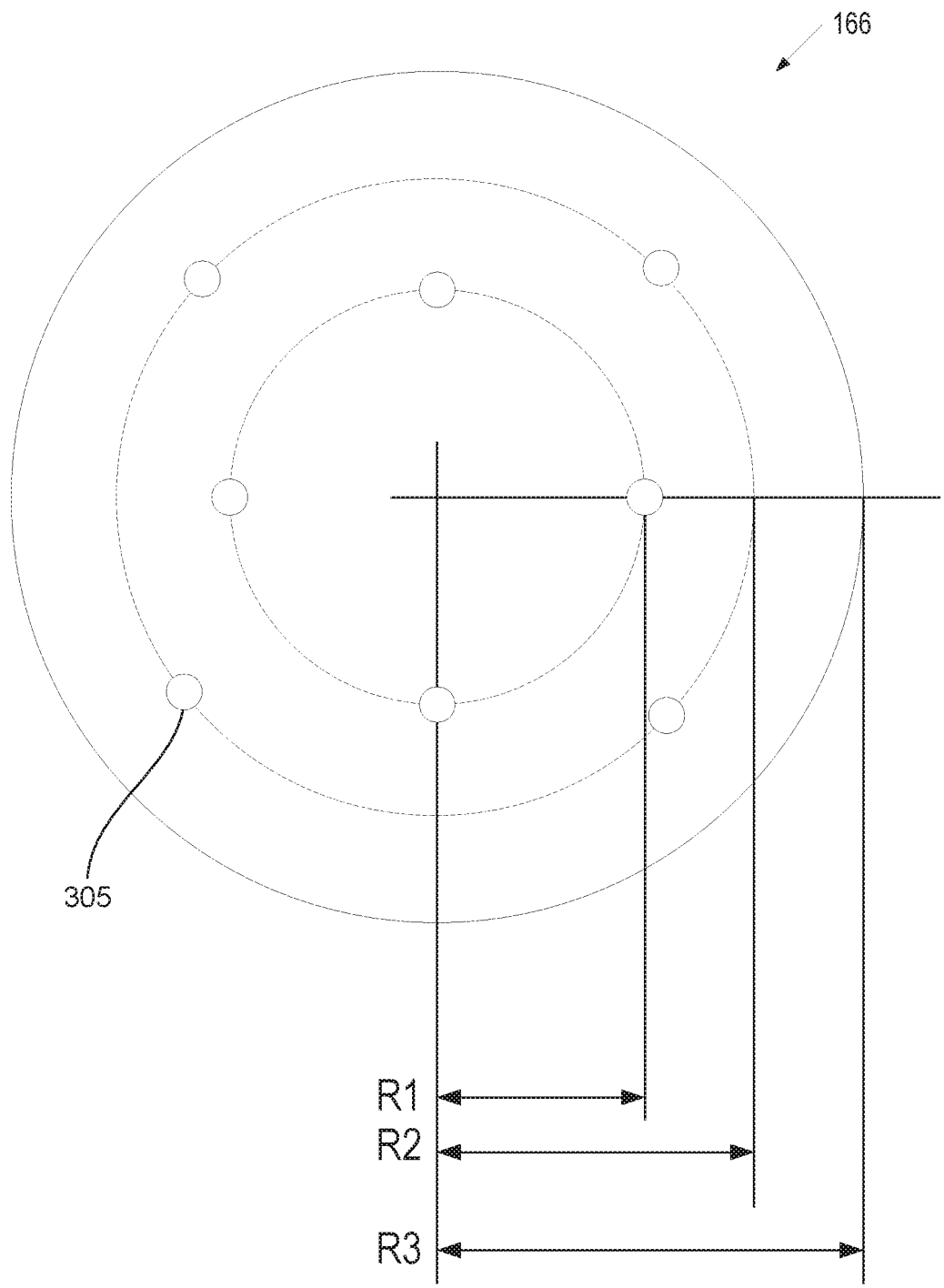
FIG. 3 depicts a sectional top view of one embodiment of an electrostatic chuck assembly.

FIG. 3 depicts a sectional top view of one embodiment of a puck 166. As shown, the puck 166 has a radius R3, which may be substantially similar to a radius of substrates or wafers that are to be supported by the puck 166. The puck 166 additionally includes multiple features 305. The features may match similar features in a cooling plate to which the puck 166 is mounted. Each feature 305 accommodates a fastener. For example, a bolt (e.g., a stainless steel bolt, galvanized steel bolt, etc.) may be placed into each feature such that a head of the bolt is inside of an opening large enough to accommodate the head and a shaft of the bolt extends out of a bottom side of the puck 166. The bolt may be tightened onto a nut that is placed in a corresponding feature in the cooling plate. Alternatively, features 305 may be sized to accommodate a nut, and may include a hole that can receive a shaft of a bolt that is accommodated by a corresponding feature in the cooling plate. In another example, a helical insert (e.g., a Heli-Coil®) or other threaded insert (e.g., a press fit insert, a mold-in insert, a captive nut, etc.) may be inserted into one or more of the features to add a threaded hole thereto. A bolt placed inside of the cooling plate and protruding from the cooling plate may then be threaded into the threaded insert to secure the cooling plate to the puck. Alternatively, threaded inserts may be used in the cooling plate.

The features 305 may be slightly oversized as compared to a size of the fasteners to accommodate a greater coefficient of thermal expansion of the fasteners. In one embodiment, the fasteners are sized such that the fasteners will not exert a force on the features when the fasteners are heated to 500 or 600 degrees Celsius.

As shown, multiple sets of features 305 may be included in the puck 166. Each set of features 305 may be evenly spaced at a particular radius or distance from a center of the puck 166. For example, as shown a first set of features 305 is located at a radius R and a second set of features 305 is located at a radius R2. Additional sets of features may also be located at additional radii.

In one embodiment, the features are arranged to create a uniform load on the puck 166. In one embodiment, the features are arranged such that a bolt is located approximately every 30-70 square centimeters (e.g., every 50 square centimeters). In one embodiment, three sets of features are used for a 12 inch puck 166. A first set of features may be located about 4 inches from a center of the puck 166 and includes about 4 features. A second set of features may be located about 6 inches from a center of the puck 166 and includes about 6 features. A third set of features may be located about 8 inches from a center of the puck 166 and includes about 8 features. In one embodiment, the puck 166 includes about 8-24 features arranged in sets at 2-3 different radii, where each feature accommodates a fastener.

Figure 4:
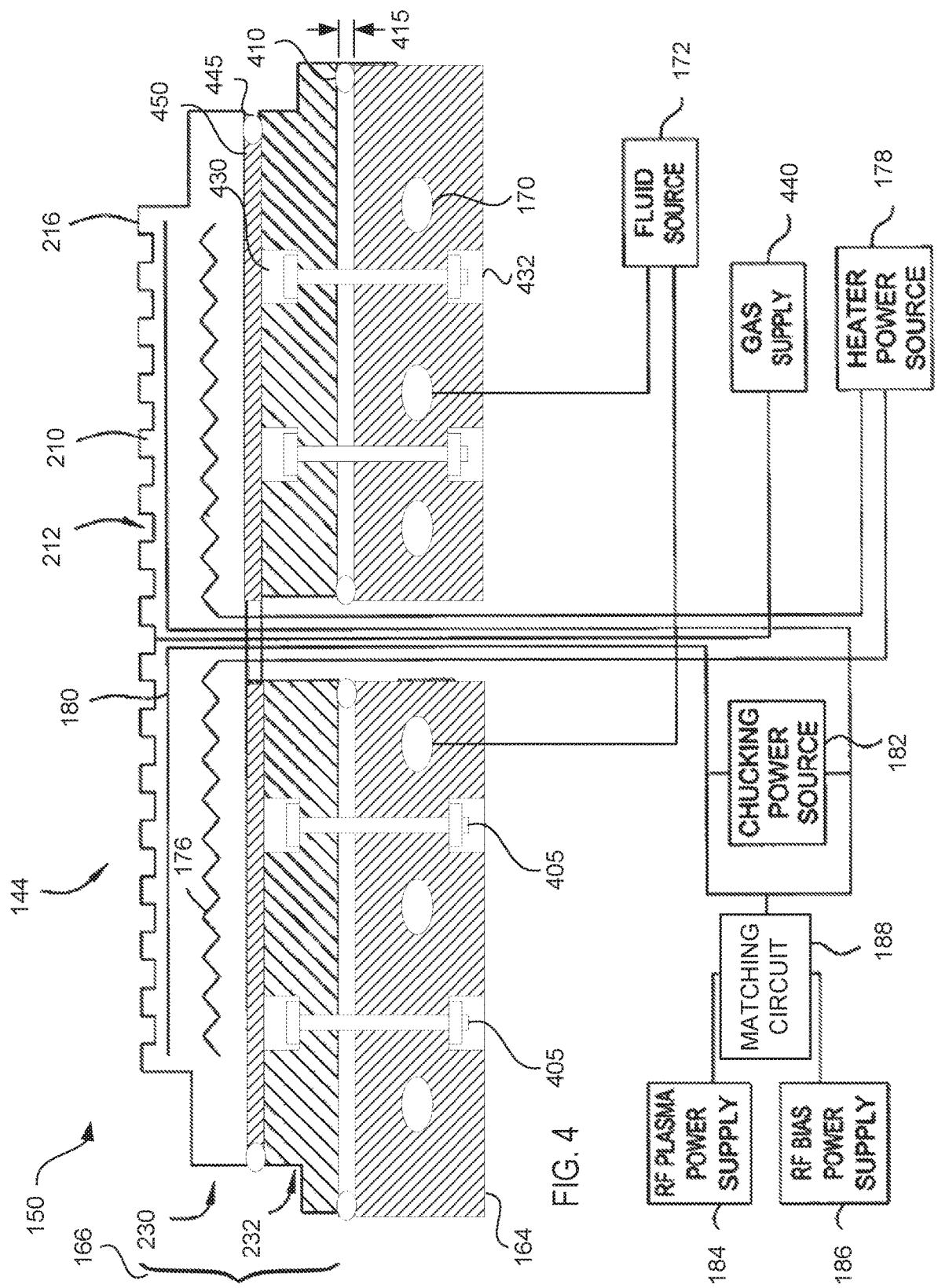
FIG. 4 depicts a sectional side view of one embodiment of an electrostatic chuck assembly.

FIG. 4 depicts a sectional side view of one embodiment of an electrostatic chuck assembly 150. The electrostatic chuck assembly 150 includes a puck 166 made up of an upper puck plate 230, and a lower puck plate 232 that are bonded together by a metal bond 450. In one embodiment, diffusion bonding is used as the method of metal bonding, but other bonding methods may also be used. In one embodiment, the upper puck plate 230 and the lower puck plate 232 comprise materials which include aluminum (e.g., AlN or Al$_2$O$_3$). Metal bond 450 may include an "interlayer" of aluminum foil which is placed in a bonding region between the upper puck plate 230 and the lower puck plate 232. Pressure and heat may be applied to form a diffusion bond between the aluminum foil and the upper puck plate 230 and between the aluminum foil and lower puck plate 232. In another embodiment, the diffusion bond may be formed using other interlayer materials which are selected based upon the materials used for upper puck plate 230 and lower puck plate 232. In another embodiment, the upper puck plate 230 may be directly bonded to the lower puck plate 232 using direct diffusion bonding in which no interlayer is used to form the bond.

A plasma resistant and high temperature o-ring 445 may be made of a perfluoropolymer (PFP). The o-ring 445 may be a PFP with inorganic additives such as SiC. The o-ring may be replaceable. When the o-ring 445 degrades it may be removed and a new o-ring may be stretched over the upper puck plate 230 and placed at a perimeter of the puck 166 at an interface between the upper puck plate 230 and the lower puck plate 232. The o-ring 445 may protect the metal bond 450 from erosion by plasma.

The upper puck plate 230 includes mesas 210, channels 212 and an outer ring 216. The upper puck plate 230 includes clamping electrodes 180 and one or more heating elements 176. The clamping electrodes 180 are coupled to a chucking power source 182, and to a RF plasma power supply 184 and an RF bias power supply 186 via a matching circuit 188. The upper puck plate 230 and lower puck plate 232 may additionally include gas delivery holes (not shown) through which a gas supply 440 pumps a backside gas such as He.

The upper puck plate 230 may have a thickness of about 3-25 mm. In one embodiment, the upper puck plate 230 has a thickness of about 3 mm. The clamping electrodes 180 may be located about 1 mm from an upper surface of the upper puck plate 230, and the heating elements 176 may be located about 1 mm under the clamping electrodes 180. The heating elements 176 may be screen printed heating elements having a thickness of about 10-200 microns. Alternatively, the heating elements may be resistive coils that use about 1-3 mm of thickness of the upper puck plate 230. In such an embodiment, the upper puck plate 230 may have a minimum thickness of about 5 mm. In one embodiment, the lower puck plate 232 has a thickness of about 8-25 mm.

The heating elements 176 are electrically connected to a heater power source 178 for heating the upper puck plate 230. The upper puck plate 230 may include electrically insulative materials such as AlN. The lower puck plate 232 and upper puck plate 232 may be made of the same materials. In one embodiment, the lower puck plate 232 is made of materials which are different from the materials used for the upper puck plate 230. In one embodiment, the lower puck plate 232 is composed of a metal matrix composite material. In one aspect, the metal matrix composite material includes aluminum and silicon. In one embodiment, the metal matrix composite is a SiC porous body infiltrated with an AlSi alloy.

The lower puck plate 232 is coupled to and in thermal communication with a cooling plate 164 having one or more conduits 170 (also referred to herein as cooling channels) in fluid communication with fluid source 172. The cooling plate 164 is coupled to the puck 166 by multiple fasteners 405. The fasteners 405 may be threaded fasteners such as nut and bolt pairs. As shown, the lower puck plate 232 includes multiple features 430 for accommodating the fasteners 405. The cooling plate 164 likewise includes multiple features 432 for accommodating the fasteners 405. In one embodiment, the features are bolt holes with counter bores. As shown, the features 430 are through features that extend through the lower puck plate 232. Alternatively, the features 430 may not be through features. In one embodiment, the features 430 are slots that accommodate a t-shaped bolt head or rectangular nut that may be inserted into the slot and then rotated 90 degrees. In one embodiment, the fasteners include washers, GRAFOIL®, aluminum foil, or other load spreading materials to distribute forces from a head of the fastener evenly over a feature.

In one embodiment (as shown), a PEP o-ring 410 is vulcanized to (or otherwise disposed on) the cooling plate at a perimeter of the cooling plate 164. Alternatively, the PFP o-ring 410 may be vulcanized to the bottom side of the lower cooling plate 232. The fasteners 405 may be tightened to compress the PFP o-ring 410. The fasteners 405 may all be tightened with approximately the same force to cause a separation 415 between the puck 166 and the cooling plate 164 to be approximately the same (uniform) throughout the interface between the puck 166 and the cooling plate 164. This may ensure that the heat transfer properties between the cooling plate 164 and the puck 166 are uniform. In one embodiment, the separation 415 is about 2-10 mils. The separation may be 2-10 mils, for example, if the PFP o-ring 410 is used without a GRAFOIL® layer. If a GRAFOIL® layer is used along with the PFP o-ring 410, then the separation may be about 10-40 mils. Larger separation may decrease heat transfer, and cause the interface between the puck 166 and the cooling plate 164 to act as a thermal choke. In one embodiment, a conductive gas may be flowed into the separation 415 to improve heat transfer between the puck 166 and the cooling plate 164.

The separation 415 minimizes the contact area between the puck 166 and the cooling plate 164. Additionally, by maintaining a thermal choke between the puck 166 and the cooling plate 164, the puck 166 may be maintained at much greater temperatures than the cooling plate 164. For example, in some embodiments the puck 166 may be heated to temperatures of 180-300 degrees Celsius, while the cooling plate 164 may maintain a temperature of below about 120 degrees Celsius. The puck 166 and the cooling plate 164 are free to expand or contract independently during thermal cycling.

The separation 415 may function as a thermal choke by restricting the heat conduction path from the heated puck 166 to the cooled cooling plate 164. In a vacuum environment, heat transfer may be primarily a radiative process unless a conduction medium is provided. Since the puck 166 may be disposed in a vacuum environment during substrate processing, heat generated by heating elements 176 may be transferred more inefficiently across the separation 415. Therefore, by adjusting the separation and/or other factors that affect heat transfer, the heat flux flowing from the puck 166 to the cooling plate 164 may be controlled. To provide efficient heating of the substrate, it is desirable to limit the amount of heat conducted away from the upper puck plate 230.

In one embodiment (not shown), a graphite foil (referred to as GRAFOIL®) layer is disposed between the puck 166 and the cooling plate 164 within a perimeter of the PFP o-ring 410. The GRAFOIL® may have a thickness of about 10-40 mil. The fasteners 405 may be tightened to compress the GRAFOIL® layer as well as the PFP o-ring 410. The GRAFOIL® may be thermally conductive, and may improve a heat transfer between the puck 166 and the cooling plate 164.

In one embodiment (not shown), the cooling plate 164 includes a base portion to which the PFP o-ring 410 may be vulcanized. The cooling plate 164 may additionally include a spring loaded inner heat sink connected to the base portion by one or more springs. The springs apply a force to press the inner heat sink against the puck 166. A surface of the heat sink may have a predetermined roughness and/or surface features (e.g., mesas) that control heat transfer properties between the puck 166 and the heat sink. Additionally, the material of the heat sink may affect the heat transfer properties. For example, an aluminum heat sink will transfer heat better than a stainless steel heat sink. In one embodiment, the heat sink includes a GRAFOIL® layer on an upper surface of the heat sink.

Figure 5:
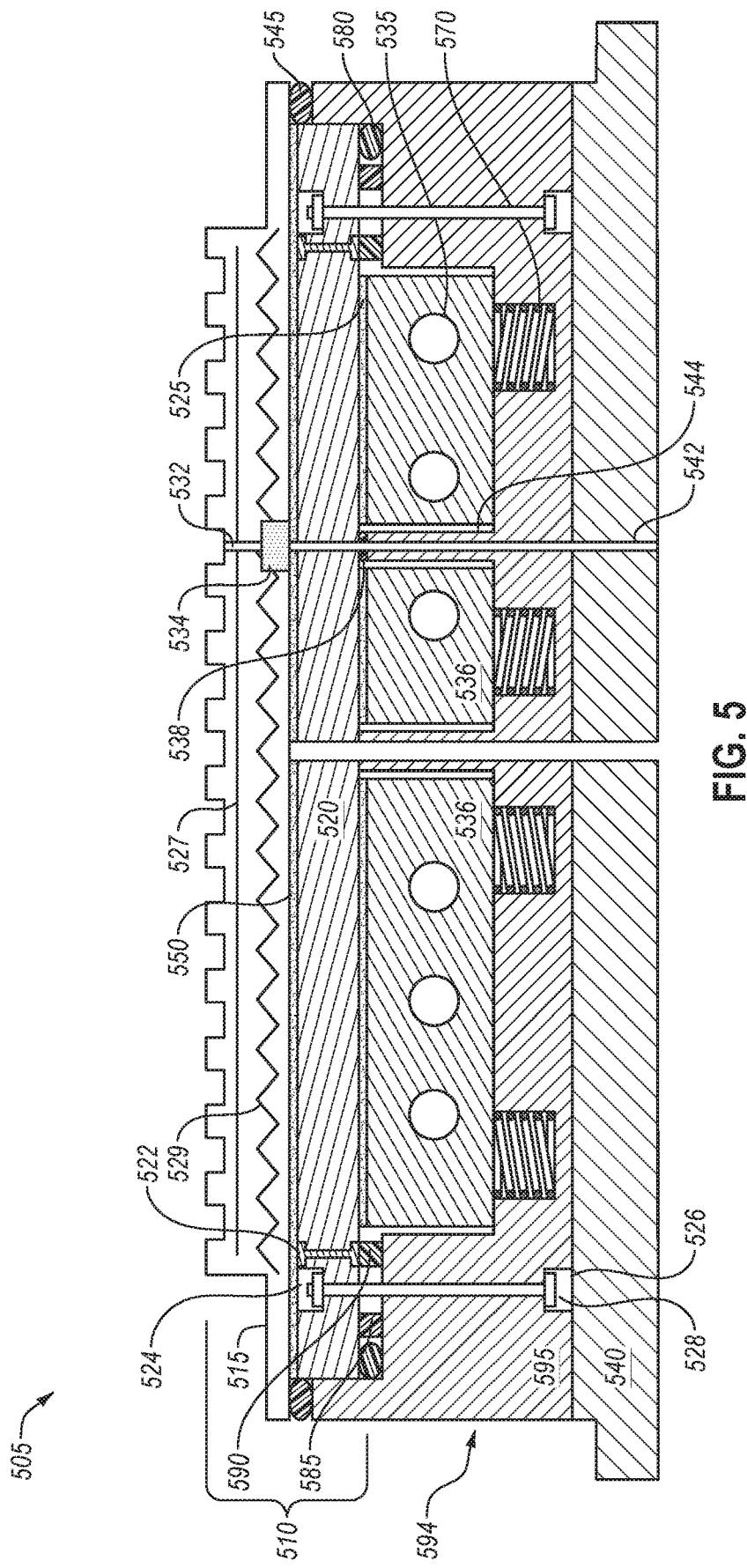
FIG. 5 depicts a sectional side view of another embodiment of an electrostatic chuck assembly.

FIG. 5 depicts a sectional side view of another embodiment of an electrostatic chuck assembly 505. In one embodiment, electrostatic chuck assembly 505 corresponds to electrostatic chuck assembly 150 of FIGS. 1-2. The electrostatic chuck assembly 505 includes an electrostatic puck 510 made up of an upper puck plate 515 and a lower puck plate 520. In one embodiment, electrostatic puck 510 corresponds to puck 166 of FIG. 3. In one embodiment, the upper puck plate 515 is bonded to the lower puck plate 520 by a metal bond 550. In one embodiment, diffusion bonding is used as the method of metal bonding. However, other bonding methods may also be used to produce the metal bond.

The upper puck plate 515 is composed of an electrically insulative (dielectric) ceramic such as AlN or $Al_2O_3$. The upper puck plate 515 includes clamping electrodes 527 and one or more heating elements 529. The clamping electrodes 527 may be coupled to a chucking power source (not shown), and to an RF plasma power supply (not shown) and an RF bias power supply (not shown) via a matching circuit (not shown). The heating elements 529 are electrically connected to a heater power source (not shown) for heating the upper puck plate 515.

The upper puck plate 515 may have a thickness of about 3-10 mm. In one embodiment, the upper puck plate 515 has a thickness of about 3-5 mm. The clamping electrodes 527 may be located about 0.3 to 1 mm from an upper surface of the upper puck plate 515, and the heating elements 529 may be located about 2 mm under the clamping electrodes 527. The heating elements 529 may be screen printed heating elements having a thickness of about 10-200 microns. Alternatively, the heating elements 529 may be resistive coils that use about 1-3 mm of thickness of the upper puck plate 515. In such an embodiment, the upper puck plate 515 may have a minimum thickness of about 5 mm.

The lower puck plate 520 is composed of a material that has a similar or matching coefficient of thermal expansion (CTE) to the upper puck plate 515. The material used for the lower puck plate 520 may be suitably chosen so that the CTE for the lower puck plate 520 material substantially matches the CTE of the electrically insulative upper puck plate 515 material in order to minimize CTE mismatch and avoid thermo-mechanical stresses which may damage the electrostatic chuck assembly 505 during thermal cycling. Accordingly, if the upper puck plate 515 is AlN, then the lower puck plate 520 may also be AlN. Similarly, if the upper puck plate 515 is $Al_2O_3$, then the lower puck plate 520 may also be $Al_2O_3$. Other materials may also be used for the lower puck plate 520 such as Molybdenum or an electrically conductive metal matrix composite (MMC) such as AlSiSiC.

In one embodiment, the lower puck plate 520 has a thickness of approximately 8-25 mm. In a further embodiment, the lower puck plate 520 has a thickness that is approximately 8-20 mm. In a further embodiment, the lower puck plate 520 has a thickness of about 12 mm.

In one embodiment, the lower puck plate 520 has a roughened outer wall that has been coated with a plasma resistant ceramic coating (not shown). The plasma resistant ceramic coating may correspond to any of the plasma resistant ceramic coatings discussed with reference to protective layer 136.

Metal bond 550 may include an "interlayer" of aluminum foil that is placed in a bonding region between the upper puck plate 515 and the lower puck plate 520. Pressure and heat may be applied to form a diffusion bond between the aluminum foil and the upper puck plate 515 and between the aluminum foil and lower puck plate 520. In other embodiments, the diffusion bonds may be formed using other interlayer materials which are selected based upon the materials used for upper puck plate 515 and the lower puck plate 520. In one embodiment, the metal bond 550 has a thickness of about 0.2-0.3 mm. In one embodiment, the upper puck plate 515 may be directly bonded to the lower puck plate 520 using direct diffusion bonding in which no interlayer is used to form the bond.

The upper puck plate 515 may have a diameter that is larger than a diameter of the lower puck plate 520. In one embodiment, the upper puck plate 515 and the lower puck plate 520 each has a diameter of about 300 mm.

An edge of a cooling plate 594 may have a similar diameter to the diameter of the upper puck plate 515. A plasma resistant and high temperature o-ring 545 may be disposed between upper puck plate 515 and a base portion 595 of the cooling plate 594. This o-ring 545 may provide a vacuum seal between an interior of the electrostatic chuck assembly 505 and a processing chamber. The o-ring 545 may be made of a perfluoropolymer (PFP). In one embodiment, the o-ring 545 is a PFP with inorganic additives such as SiC. The o-ring 545 may be replaceable. When the o-ring 545 degrades it may be removed and a new o-ring may be stretched over the upper puck plate 515 and placed at a perimeter of the upper puck plate 515 at an interface between the upper puck plate 515 and the cooling plate 594. The o-ring 545 may protect the metal bond 550 from erosion by plasma.

The cooling plate 594 includes base portion (also referred to as a cooling base) 595 and a heat sink (e.g., an inner heat sink) 536. The heat sink 536 may be coupled to the base portion 595 by one or more springs 570, which operate to press the heat sink 536 against the lower puck plate 520. In one embodiment, the springs 570 are coil springs. The springs 570 apply a force to press the heat sink 536 against the electrostatic puck 510. The heat sink 536 may have one or more conduits 535 (also referred to herein as cooling channels) in fluid communication with a fluid source (not shown). A surface of the heat sink 536 may have a predetermined roughness and/or surface features (e.g., mesas) that affect heat transfer properties between the electrostatic puck 510 and the heat sink 536. Additionally, the material of the heat sink 536 may affect the heat transfer properties. For example, an aluminum heat sink 536 will transfer heat better than a stainless steel heat sink 536. In one embodiment, a mounting plate 540 is disposed beneath and coupled to the cooling plate 594.

The lower puck plate 520 may include numerous features 524 for receiving fasteners 526. The cooling plate 594 may likewise include multiple features 528 for accommodating the fasteners 526. Alternatively, or additionally, the mounting plate 540 may include multiple features for receiving fasteners. Features 528 may line up vertically with features 524. The features 524, 528 may be through features that extend through the lower puck plate 520 and cooling plate 594. Alternatively, the features 524, 528 may not be through features. In one embodiment, the features 524, 528 are bolt holes with counter bores. In one embodiment, the features 524, 528 are slots that accommodate a t-shaped bolt head or rectangular nut that may be inserted into the slot and then rotated 90 degrees.

In one embodiment, the cooling plate 594 is coupled to the electrostatic puck 510 by multiple fasteners 526 that are inserted into the features 528, 524. The fasteners 526 may be stainless steel, galvanized steel, molybdenum, or other metal. The fasteners 526 may be threaded fasteners such as nut and bolt pairs. In one embodiment, the fasteners 526 include washers, GRAFOIL®, aluminum foil, or other load spreading materials to distribute forces from a head of the fastener evenly over a feature. In one embodiment, a helical insert (e.g., a Heli-Coil®) or other threaded insert (e.g., a press fit insert, a mold-in insert, a captive nut, etc.) may be inserted into features 524 to add a threaded hole thereto. A bolt placed inside of the cooling plate 594 (e.g., inside features 524 in the base portion 595 of the cooling plate 594) and protruding from the cooling plate 594 may then be threaded into the threaded insert to secure the cooling plate to the puck. Alternatively, threaded inserts may be used in the cooling plate.

In one embodiment, a captive nut, mold insert, press fit insert, or other threaded insert is positioned inside of features 524. In a further embodiment, at least a portion of the threaded inserts is brazed prior to insertion into the features 524. Alternatively, a metal foil may be placed between the threaded insert and a surface of the feature 524. A metal bonding (e.g., diffusion bonding) procedure may then be performed to secure the threaded insert to the feature 524. This may provide increased durability for application of increased force during assembly.

The heat sink 536 and/or base portion 595 of the cooling plate 594 may absorb heat from the electrostatic puck 510. In one embodiment (as shown), a low thermal conductivity gasket 525 is disposed on the heat sink 536. The low thermal conductivity gasket 525 may be, for example, a PFP gasket that is vulcanized to (or otherwise disposed on) the heat sink 536. In one embodiment, the low thermal conductivity gasket has a thermal conductivity of about 0.2 Watts per meter Kelvin (W/(m·K)) or lower. The fasteners 526 may be tightened with approximately the same force, and the springs 570 may press the heat sink 536 against the lower puck plate 520 to evenly compress the low thermal conductivity gasket 525. The low thermal conductivity gasket 525 may decrease heat transfer and act as a thermal choke.

In one embodiment, a graphite foil (referred to as GRAFOIL®) layer (not shown) is disposed over the low thermal conductivity gasket 525. The GRAFOIL® may have a thickness of about 10-40 mil. The fasteners 526 and/or springs 570 may compress the GRAFOIL® layer as well as the low thermal conductivity gasket 525. The GRAFOIL® may be thermally conductive, and may improve a lateral heat transfer across the heat sink 536.

By maintaining a thermal choke between the electrostatic puck 510 and the cooling plate 594, the electrostatic puck 510 may be maintained at much greater temperatures than the cooling plate 594. For example, in some embodiments the electrostatic puck 510 may be heated to temperatures of 200-300 degrees Celsius, while the cooling plate 594 may maintain a temperature of below about 120 degrees Celsius. In one embodiment, the electrostatic puck 510 may be heated up to a temperature of about 250° C. while maintaining the cooling plate 594 at a temperature of about 60° C. or below. Accordingly, up to a 190° C. delta may be maintained between the electrostatic puck 510 and the cooling plate 594 in embodiments. The electrostatic puck 510 and the cooling plate 594 are free to expand or contract independently during thermal cycling.

In some embodiments it may be desirable to provide an RF signal through the electrostatic puck 510 and to a supported substrate during processing. In one embodiment, to facilitate the transmission of such an RF signal through the electrostatic puck 510, an electrically conductive gasket referred to as an RF gasket 590 is disposed on the base portion 595 of the cooling plate 594. The RF gasket may have a conductivity on the order of $10^3$ Ohm·meter or better and may retain a spring action at temperatures of up to about 300 degrees C. In one embodiment, the RF gasket is Inconel (an alloy of nickel containing chromium and iron) coated in gold, copper or silver. The RF gasket 590 may electrically connect the base portion 595 of the cooling plate 594 to the lower puck plate 520.

In embodiments in which the lower puck plate 520 has a low electrical conductivity (e.g., if the lower puck plate 520 is AlN or $Al_2O_3$), a hole may be drilled in the lower puck plate 520 where the lower puck plate 520 will contact the RF gasket. The hole may then be filled with a high conductivity material such as a metal (e.g., a metal rod having a conductivity on the order of $10^{-1}$ Ohm·meter or better). For example, the hole may be filled with aluminum, tungsten, copper, nickel, molybdenum, silver, gold, etc. Accordingly, an electrically conductive path 522 may be formed in the lower puck plate 520 to electrically connect the RF signal to the metal bond 550. In one embodiment, an electrically conductive pad is formed at the surfaces of the lower puck plate 520 around the electrically conductive path 522. This may ensure good electrical contact to the metal bond 550 and the RF gasket 590. In one embodiment, a shallow recess is bored into the lower puck plate 520 centered on the hole formed for the electrically conductive path 522. The shallow recess may also be filled with a metal or other conductive material. In the illustrated example, the RF gasket 590 and electrically conductive path 522 are on an outside of the heat sink 536 (e.g., at a further distance from a center of the electrostatic chuck assembly 505 than the heat sink 536). Alternatively, the RF gasket 590 and electrically conductive path 522 may be formed near a center of the electrostatic chuck assembly 505.

In one embodiment, an electrically conductive path between the metal bond 550 and the RF gasket 590 is formed by coating an outer wall of the lower puck plate 520 with a metal layer. The metal layer may be aluminum, copper, gold, silver, an alloy thereof, or another metal. A top and bottom of the lower puck plate 520 may also be coated with the metal layer near the outer wall to ensure a good electrical contact. In such an embodiment, the RF gasket 590 may be positioned near the outer wall of the lower puck plate 520.

In another embodiment, an electrically conductive path between the metal bond 550 and the RF gasket 590 is formed by coating the walls of a center hole in the lower puck plate 520 with a metal layer. The metal layer may be aluminum, copper, gold, silver, an alloy thereof, or another metal. A top and bottom of the lower puck plate 520 may also be coated with the metal layer near the outer wall to ensure a good electrical contact. In such an embodiment, the RF gasket 590 may be positioned near the center of the lower puck plate 520.

In one embodiment, a thermal spacer 585 is disposed on the base portion 595 of the cooling plate 594 (e.g., adjacent to the RF gasket 590). The thermal spacer 585 may be used to ensure that the base portion 594 of the cooling plate 595 will not come into contact with the lower puck plate 520. In one embodiment, an o-ring 580 is disposed adjacent to the thermal spacer 585. The o-ring 580 may be a PFP o-ring in one embodiment. The o-ring 580 may be used to facilitate a vacuum seal.

In one embodiment, one or more gas holes 532, 542 are drilled into the cooling plate 594, the lower puck plate 520 and the upper puck plate 515. The gas holes 532, 542 may be used to deliver a backside gas such as helium to a backside of a chucked substrate. In one embodiment, the upper puck plate 515 includes a gas hole 532 that terminates at a porous plug 534. The gas hole 532 may be a through hole that is counter bored with a larger diameter bore to permit the porous plug 534 to be inserted into the larger diameter bore. The porous plug 534 may be a porous ceramic such as AlN or $Al_2O_3$. The porous plug 534 may prevent arcing and/or may prevent a plasma from being generated within the electrostatic puck 505. The porous plug may have a porosity of anywhere between about 30% to about 60%.

In one embodiment, the heat sink 536 includes a hole, and the base portion 595 of the cooling plate 594 includes a projection 544 that extends through the hole in the heat sink 536. The hole 542 may be bored into the projection 544 (e.g., into a center of the projection 544). In one embodiment, an o-ring 538 is disposed on a top of the projection 544. The fasteners 526 may compress the o-ring 538 when tightened. The o-ring 538 may be a same type of o-ring as o-ring 545 and/or o-ring 580.

Figure 6:
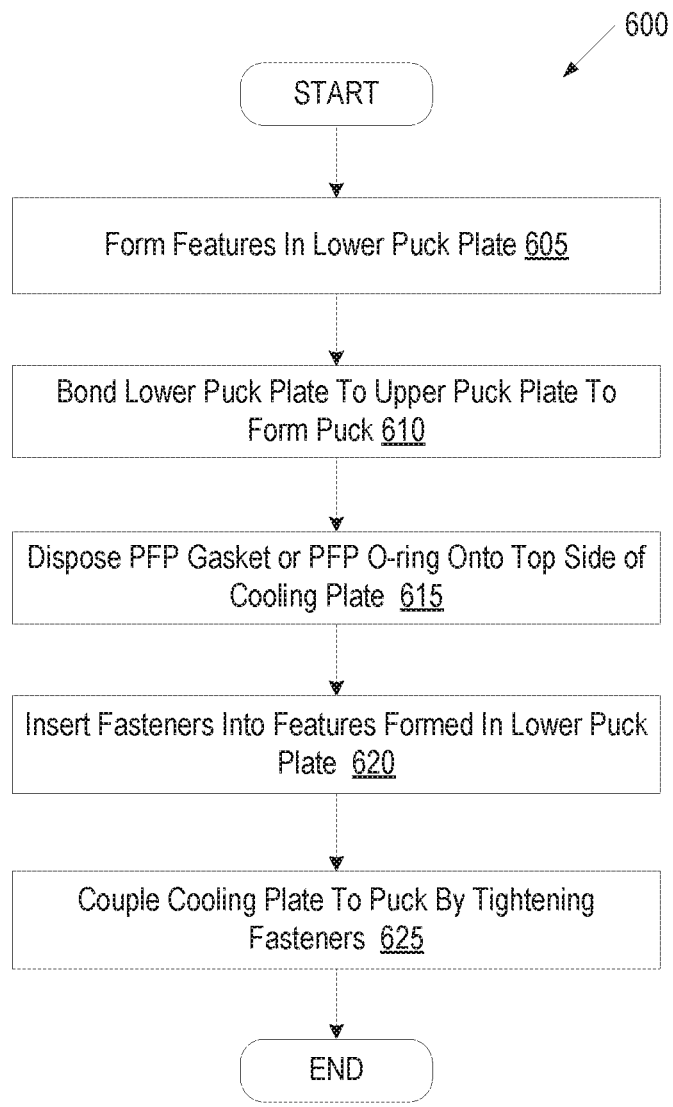
FIG. 6 illustrates one embodiment of a process for manufacturing an electrostatic chuck assembly.

FIG. 6 illustrates one embodiment of a process 600 for manufacturing an electrostatic chuck assembly. At block 605 of process 600, features are formed in a lower puck plate. The lower puck plate may be an AlSiSiC plate, an AlN plate, an $Al_2O_3$ plate, or a Molybdenum plate. The features formed in the lower puck plate may include features for accommodating fasteners. Additionally, one or more gas holes may be drilled into the lower puck plate. Additionally, one or more other holes may be drilled into the lower puck plate and filled with a metal rod or other electrically conductive material to provide an electrically conductive path for an RF signal. In one embodiment, a shallow bore is drilled at both ends of the one or more other holes in the lower puck plate and filled with a metal or other electrically conductive material. The upper puck plate may also be processed to form one or more gas delivery holes. In one embodiment, the gas delivery holes in the upper puck plate are counter bored and the counter bore is filled with a porous plug.

At block 610, the lower puck plate is metal bonded to the upper puck plate to form a puck. The upper puck plate may be an electrically insulative material (a dielectric) with embedded heating elements and clamping electrodes. In one embodiment, the metal bond is formed by placing a metal foil of Al or AlSi alloy between the upper puck plate and the lower puck plate. The metal foil may be approximately 50 microns thick in one embodiment. Pressure and heat may be applied to form a diffusion bond between the metal foil, the upper puck plate and the lower puck plate.

In one embodiment, prior to bonding the upper puck plate to the lower puck plate threaded inserts are placed into the features formed in the lower puck plate. In one embodiment, the threaded inserts are brazed. In another embodiment, a metal foil is placed into the features prior to placement of the threaded inserts into the features. During the metal bonding process, the threaded inserts may be bonded to the lower puck plate by a metal bond.

At block 615, a PFP gasket or o-ring is disposed on a top side of a cooling plate. In one embodiment, the PFP gasket or o-ring is vulcanized to the top side of the cooling plate. The cooling plate may be, for example, an aluminum or aluminum alloy cooling plate with multiple channels to flow a cooling fluid. The cooling plate may also have features formed therein. The features in the cooling plate and the features in the lower puck plate may each accommodate a fastener (e.g., a bolt and/or nut). In one embodiment, the cooling plate includes a base portion and a heat sink. The PFP gasket may be disposed on the heat sink, and the features may be formed in the base portion in some embodiments. In one embodiment, a GRAFOIL® layer is formed over the PFP gasket.

At block 620, fasteners are inserted into the features in the lower puck plate and/or the cooling plate. In one embodiment, the fasteners (or at least a portion of the fasteners) are inserted into the lower puck plate prior to the lower puck plate being bonded to the upper puck plate. In such an embodiment, the fasteners may be permanently embedded into the puck. At block 625, the puck is coupled to the cooling plate by tightening the fasteners (e.g., by threading bolts protruding from the features in the lower puck plate into nuts residing in the features in the cooling plate.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An electrostatic chuck assembly comprising:
   a puck comprising:
      an electrically insulative upper puck plate comprising one or more heating elements and one or more electrodes to electrostatically secure a substrate; and
      a lower puck plate bonded to the electrically insulative upper puck plate by a metal bond, the lower puck plate comprising a plurality of features distributed over the lower puck plate at a plurality of different distances from a center of the lower puck plate, wherein each of the plurality of features accommodates one of a plurality of fasteners;
   a cooling plate coupled to the lower puck plate by the plurality of fasteners; and
   at least one of a gasket or an o-ring disposed on a top side of at least a portion of the cooling plate, wherein the plurality of fasteners each apply an approximately equal fastening force to couple the cooling plate to the puck, to compress at least one of the o-ring or the gasket, and to maintain an approximately equal separation between the cooling plate and the lower puck plate and facilitate a uniform heat transfer between the cooling plate and the lower puck plate.

2. The electrostatic chuck assembly of claim 1, wherein the gasket is a perfluoropolymer (PFP) gasket, and wherein the PFP gasket acts as a thermal choke between the cooling plate and the puck.

3. The electrostatic chuck assembly of claim 1, further comprising:
   a flexible graphite layer on the gasket.

4. The electrostatic chuck assembly of claim 1, wherein the cooling plate comprises:
   a base portion; and
   a spring loaded heat sink connected to the base portion by a plurality of springs, wherein the plurality of springs apply a force to press the spring loaded heat sink against the lower puck plate.

5. The electrostatic chuck assembly of claim 1, wherein the plurality of fasteners comprise a plurality threaded fasteners and the plurality of features comprise a plurality of openings for receiving the plurality of threaded fasteners.

6. The electrostatic chuck assembly of claim 1, further comprising:
   an interface between the puck and the cooling plate, wherein the interface acts as a thermal choke that is configured to maintain a temperature difference between the cooling plate and the substrate of up to approximately 190° C.

7. The electrostatic chuck assembly of claim 1, wherein the electrically insulative upper puck plate comprises AlN and the lower puck plate comprises one of a) Molybdenum or b) a SiC porous body infiltrated with an AlSi alloy.

8. The electrostatic chuck assembly of claim 1, wherein the electrically insulative upper puck plate comprises $Al_2O_3$ and the lower puck plate comprises $Al_2O_3$.

9. The electrostatic chuck assembly of claim 1, wherein the electrically insulative upper puck plate comprises AlN and the lower puck plate comprises AlN.

10. The electrostatic chuck assembly of claim 1, wherein the o-ring is disposed around a perimeter of the puck at an interface between the electrically insulative upper puck plate and a base portion of the cooling plate.

11. The electrostatic chuck assembly of claim 1, further comprising:
    an electrically conductive path between a top of the lower puck plate and a bottom of the lower puck plate.

12. The electrostatic chuck assembly of claim 11, wherein the electrically conductive path comprises a hole filled with an electrically conductive material.

13. An electrostatic chuck assembly, comprising:
    a puck comprising:
       an electrically insulative upper puck plate comprising one or more heating elements and one or more electrodes to electrostatically secure a substrate; and
       a lower puck plate bonded to the electrically insulative upper puck plate by a metal bond, the lower puck plate comprising a plurality of features distributed over the lower puck plate at a plurality of different distances from a center of the lower puck plate, wherein each of the plurality of features accommodates one of a plurality of fasteners; and
       an electrically conductive path between a top of the lower puck plate and a bottom of the lower puck plate;
    a cooling plate coupled to the lower puck plate by the plurality of fasteners, wherein the plurality of fasteners each apply an approximately equal fastening force to couple the cooling plate to the puck; and
    an electrically conductive gasket between the lower puck plate and the cooling plate, wherein the electrically conductive gasket contacts the electrically conductive path.

14. A method comprising:
    forming a plurality of features in a lower puck plate, wherein the plurality of features are distributed over the lower puck plate at a plurality of different distances from a center of the lower puck plate, wherein each of the plurality of features accommodates one of a plurality of fasteners;
    bonding the lower puck plate to an electrically insulative upper puck plate with a metal bond to form a puck, the electrically insulative upper puck plate comprising one or more heating elements and one or more electrodes to electrostatically secure a substrate;
    disposing at least one of a gasket or an o-ring to a top side of at least a portion of a cooling plate;
    inserting one of the plurality of fasteners into each of the plurality of features formed in the lower puck plate; and
    coupling the cooling plate to the puck by tightening the plurality of fasteners, wherein the plurality of fasteners are tightened approximately equally to apply an approximately equal fastening force to couple the cooling plate to the puck, to compress at least one of the o-ring or the gasket, and to maintain an approximately equal separation between the cooling plate and the lower puck plate and facilitate a uniform heat transfer between the cooling plate and the lower puck plate.

15. The method of claim 14, further comprising:
    disposing a flexible graphite layer on the gasket.

16. The method of claim 14, further comprising:
  forming an electrically conductive path between a top of the lower puck plate and a bottom of the lower puck plate.

17. The electrostatic chuck assembly of claim 13, further comprising:
  at least one of a gasket or an o-ring disposed on a top side of at least a portion of the cooling plate.

18. The electrostatic chuck assembly of claim 17, wherein the gasket acts as a thermal choke between the cooling plate and the puck.

19. The electrostatic chuck assembly of claim 18, further comprising:
  a flexible graphite layer on the gasket.

20. The electrostatic chuck assembly of claim 13, wherein the cooling plate comprises:
  a base portion; and
  a spring loaded heat sink connected to the base portion by a plurality of springs, wherein the plurality of springs apply a force to press the spring loaded heat sink against the lower puck plate.

* * * * *